United States Patent [19]

Sibley

[11] 4,301,120
[45] Nov. 17, 1981

[54] CHAIN INTRODUCTION MEANS FOR A CRYSTAL GROWTH PULLING HEAD

[75] Inventor: Clifton B. Sibley, Needham, Mass.

[73] Assignee: Ferrofluidics Corporation, Nashua, N.H.

[21] Appl. No.: 183,540

[22] Filed: Sep. 2, 1980

[51] Int. Cl.³ .................................................. C30B 15/30
[52] U.S. Cl. ............................ 422/249; 156/DIG. 98
[58] Field of Search ................... 422/249; 156/617 SP, 156/DIG. 98

[56] References Cited

U.S. PATENT DOCUMENTS

| | | | |
|---|---|---|---|
| 1,364,895 | 1/1921 | Slinglvtt | 156/617 SP |
| 2,753,280 | 7/1956 | Moore | 148/1.5 |
| 3,511,609 | 5/1970 | Kato | 422/249 |

*Primary Examiner*—Hiram Bernstein
*Attorney, Agent, or Firm*—Richard P. Crowley

[57] ABSTRACT

A crystal puller uses a chain and sprocket in the pulling head for vertical support of the growing crystal. Replacement of the chain is effectuated by providing an aperture in the top of the pulling head aligned with the sprocket. Replacement chain fed through the aperture can be directed to a storage area initially then by reverse sprocket motion lowered to commence a crystal growth cycle.

6 Claims, 3 Drawing Figures

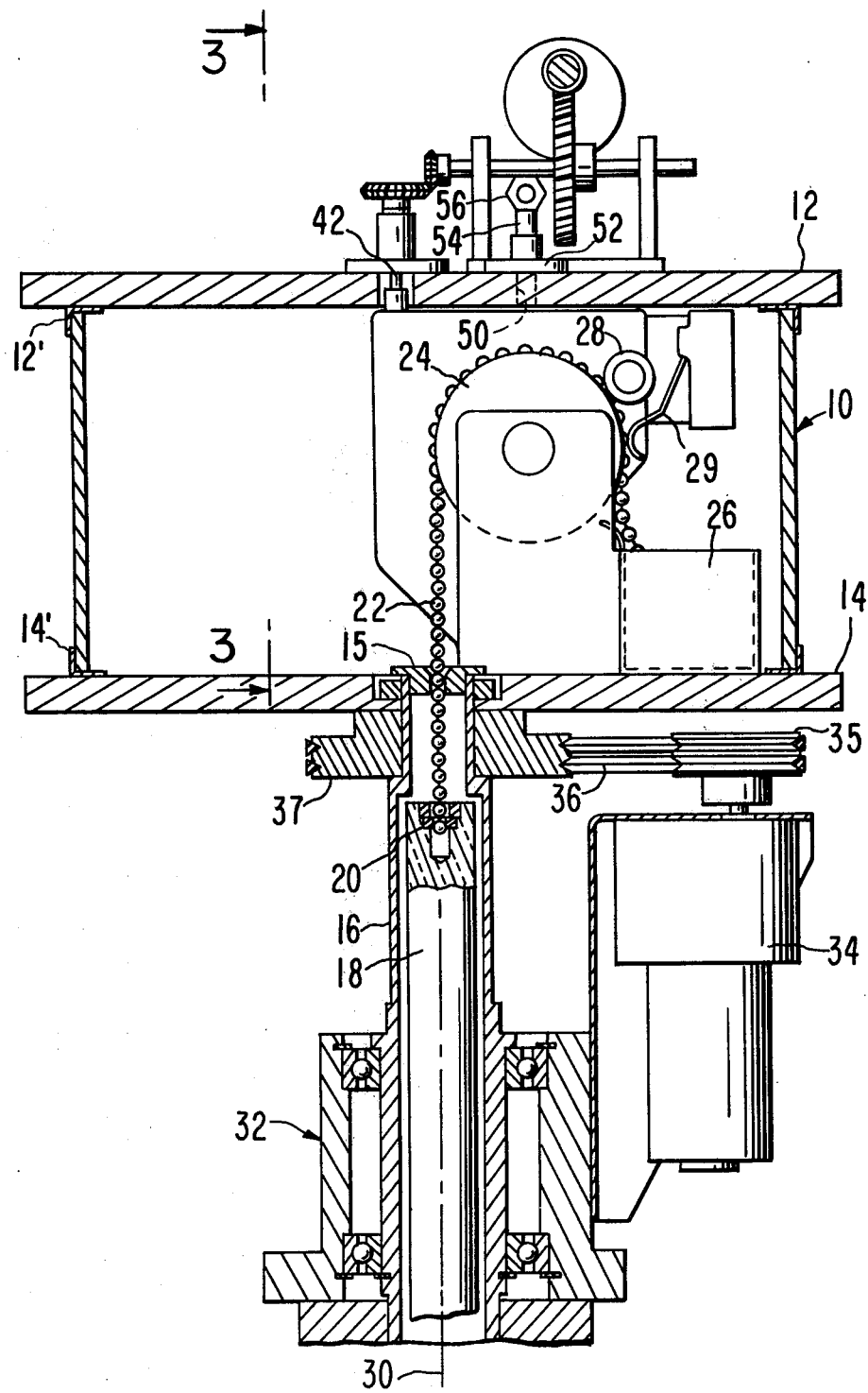

CHAIN INTRODUCTION MEANS FOR A CRYSTAL GROWTH PULLING HEAD

DESCRIPTION

Field of the Invention

The invention is in the field of apparatus for drawing a single crystal from a melt and more particularly relates to a pulling head for a Czochralski crystal growth apparatus wherein said crystal is supported by a chain.

BACKGROUND OF THE INVENTION

Apparatus for the growth of single crystals by the Czochralski method includes a crucible to contain a melt in a mechanism for concurrently drawing a crystal from the melt on a vertical axis at a substantially steady rate while providing relative rotation about this axis for the growing crystal in respect to the melt. Vertical lift of the growing crystal is effectuated from the "pulling head" portion of the apparatus which must maintain mechanical alignment of the axis of rotation with the vertical pulling axis while providing ease of access for maintenance and rapid turn around time in a production context. Moreover, in one class of apparatus it is desirable to carry out the process in a vacuum-tight housing in order to obtain improved freedom from contamination.

It is known in prior art to employ a ball chain for supporting and vertically lifting the crystal as it is drawn from the melt together with a take-up drum for storage of the untensioned chain. In a known apparatus the alignment of the pulling axis, gravitationally defined by the ball chain with the rotation axis is maintained by causing the take-up drum to travel along a lead screw, transverse to the crystal pulling rotation axis. The known drum translation apparatus employs a keyed or splined mechanism or linear ball bushing to constrain the drum translation to its rotational axis during rotation of the drum. A fixed nut and lead screw on the axis of the drum have such a thread pitch to translate the drum by an amount equal to the width of the chain. Thus the chain is maintained tangent with the drum circumference and in constant alignment with the desired crystal rotation axis. The lubrication requirements for the lead screw and spline of the known chain pulling mechanism is clearly ill-suited to contain a contamination-free environment desired for crystal growth with the present invention.

The transverse travel requirements for the drum of this prior art mechanism further enlarges the volume of the pulling head and effects the balance, the mechanism which controls the rotation about the vertical axis. The winding on the chain of the drum is a source of uneven lift as the chain increments relax against the drum surface while under tension. Such relaxation occurs in an uncontrolled fashion and small irregularities in vertical pulling are thereby introduced.

Crystal pulling apparatus of the form above-described utilizes a "ball chain" taking the form of a linkage of spherical beads. In common with the prior art apparatus above-described, copending application Ser. No. 119,913 describes a compact pulling head which effectuates long pull lengths utilizing the ball-chain and a sprocket adapted to conform to the shape of the chain bead by formation of pockets in the lateral surface of the sprocket. The desired support and rotation axis is congruent with a tangent from the sprocket and untensioned chain is accommodated in a storage space proximate the sprocket. In this apparatus stability and control of the growing crystal are substantially improved while maintaining uniform rotational and vertical motions. This arrangement has a number of advantageous properties but in common with the afore-mentioned prior art mechanism, the chain or cable must be replaced at moderately frequent intervals of use. In the prior art apparatus the chain is secured to the drum directly by mechanical fasteners. Consequently, the pulling head must be opened to secure the fixed end of the replacement chain to the drum. In the apparatus of the copending application it is also necessary to open the pulling head to install a new chain although no drum must be aligned, nor must the chain be secured by a fastener to a take-up mechanism. Thus, both of the above described apparatus require disturbing large vacuum seals and further result in downtime of the order of hours.

BRIEF DESCRIPTION OF THE INVENTION

An object of the present invention is the improvement of a pulling head for a crystal growing furnace of the Czochralski type.

In one feature of the invention the growing crystal is suspended by ball chain, pulling is accomplished with a sprocket adapted to such chain and said chain is introduced to said apparatus through an aperture above and aligned with said sprocket.

In another feature of the invention, the chain is introduced to the aperture through a guide tube.

In yet another feature of the invention, the guide tube is adapted to receive a sealing cap to hermetically seal an envelope enclosing the crystal growing furnace.

This object and features are realized in apparatus which separates the vertical actuation of the chain and the chain take-up through provision of a sprocket for the vertical pulling function and a storage space for the storage of untensioned (taken-up) chain. The sprocket engaging the chain is characterized by concave pockets forming the sprocket teeth, such pockets conforming to the spherical beads of the ball-chain. As a result of this configuration the chain, introduced from above is easily engaged by the sprocket and permits simple replacement of the entire chain length without disassembly of the pulling head.

Chain replacement is accomplished by discharge of the free end of the chain from the sprocket into the storage space.

BRIEF DESCRIPTION OF THE FIGURES

FIG. 2 is a partially schematic view of the pulling head of the present invention.

DETAILED DESCRIPTION OF THE INVENTION

Figure 1:
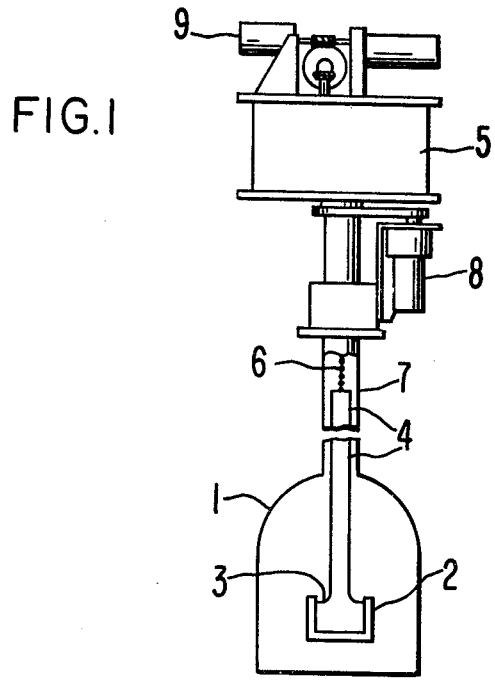
FIG. 1 shows schematically a crystal pulling system in the context of the present invention.

A crystal growing system which defines the context of the present invention is outlined briefly in FIG. 1. A furnace 1 heats a melt 3 of the feedstock of the desired crystal material contained in crucible 2 of refractory material (ordinarily quartz for its infra-red transmission properties). A crystal 4 is pulled from the melt 3 by pulling head 5 through linkage 6. A housing 7 surrounds the entire apparatus to maintain freedom from contaminants and in some instances to provide a hermetic envelope to support a vacuum or inert atmosphere. Motors 8 and 9 provide relative rotational and pulling motions of the growing crystal with respect to the melt.

Figure 3:
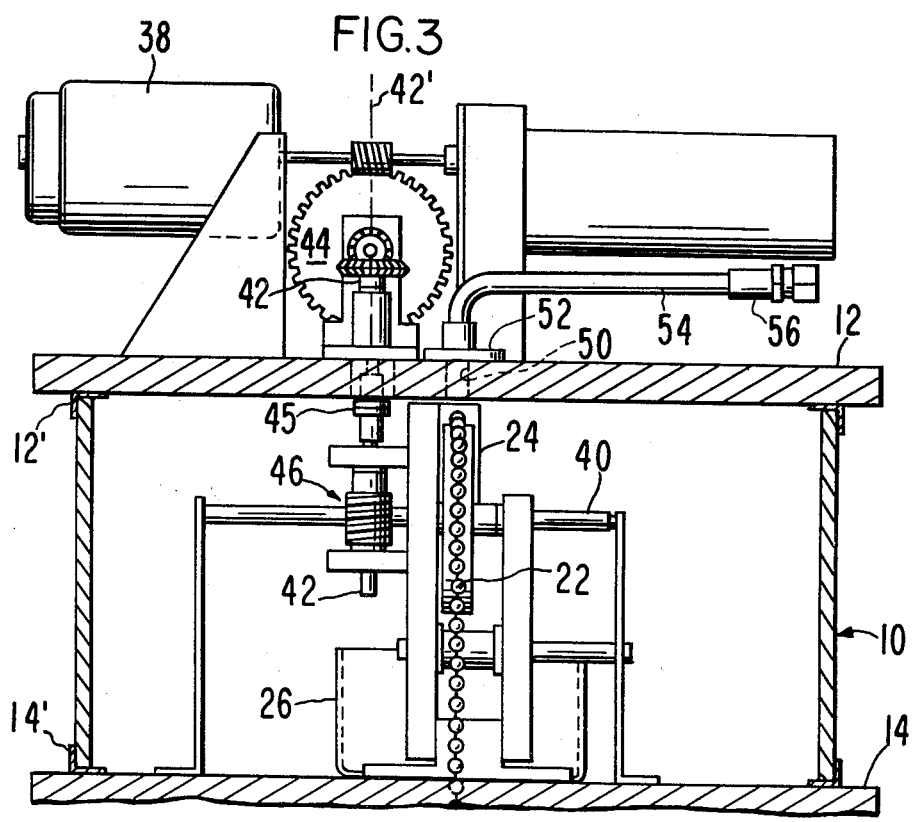
FIG. 3 is another view of a part of the mechanism of FIG. 2.

The invention is best described with the aid of FIGS. 2 and 3 which show the salient components of the pulling head and mechanism. A housing 10, preferably formed of a transparent material, is closed on both ends by a top plate 12 and by a bottom plate 14 to form the pulling head enclosure. Seals 12' and 14' are shown here as flat gaskets merely for convenience. The bottom plate 14 communicates through guide plug 15 with the vertical column 16 of the full crystal growing system. A growing crystal 18 drawn from a melt, not shown, is supported from a seed holder 20 supported by the ball-chain 22. Ball-chain 22 may be formed of a plurality of hollow spherical members, loosely linked to adjacent like members by rod or tubular dumbbell-shaped segments. The ball-chain 22 engages sprocket 24 and the untensioned or free end of ball-chain 22 is discharged from sprocket 24 to collect in container 26 or alternatively in an unconfined portion of the envelope adjacent sprocket 24. Sprocket 24 is formed from a cylindrical section, the curved surface of which has pockets formed in such surface to accommodate the links of the ball-chain 22 in order to assure enough wrap around the sprocket 24 to support the weight of the growing crystal, and idler pulley 28 constrains the free end of ball-chain 22 to sprocket 24. Switch actuator 29 senses an imminent end-of-chain condition. This assures the desired feeding of the free end of ball-chain 22 to the seedholder.

The entire pulling head is adapted for rotation about vertical axis 30 through bearing assembly 32. Fixed motor 34 drives the entire pulling head through motor pulleys 35, belts 36 and head pulleys 37. Vertical pulling power is provided by motor 38 through a transmission train schematically illustrated in FIG. 3. This transmission is conventional and provides a reduction appropriate to turn sprocket shaft 40 at a rotational speed in the desired range from about 0.1 to 1.5 revolutions per hour. Further adjustment of pulling rate is obtained by choice of the diameter for sprocket 24. This has been selected to produce a circumference of about 10 inches; the reduction ratios in cooperation with such sprocket diameter yields vertical pull rates in the range 1–15 inches per hour. Accordingly, rotational power is provided to shaft 42 on vertical transmission axis 42' through intermediate reduction gearing 44. Vertical shaft 42 is built in two portions with couplings 45 provided to permit simple removal of top plate 12 for axis to the mechanisms when major maintenance is required. Right angle drive 46, for example, a worm in wormwheel set, provides further reduction gearing and transmits power to sprocket shaft 40.

Whereas the traveling drum pulling head of the prior art employed a fixed length chain the present apparatus uses variable length chain. The excess chain stored in container 26 permits frequent removal of a portion of chain approximate the crystal seed holder. Because the strength of the chain is degraded by continuous exposure to high temperatures in this region, the likelihood of chain failure is minimized by routine removal of the portion of chain so exposed before initiating new crystal growth. The excess chain permits this routine practice. Chain failure, it will be noted, is a disasterous occurence resulting in loss of a crystal grown at great expense, and likely damage to the crucible and hot zone components as well as considerable amounts of time to restore the condition of the apparatus.

A conscientious program of preventive maintenance is essential to assure trouble-free operation of the apparatus. A central aspect of this program is the replacement of chain at the appropriate intervals. To facilitate this replacement the present invention employs aperture 50 in cover plate 12. This aperture is aligned with the plane of sprocket 24. A flange 52 is adapted to join tubular member 54 to cover plate 12 in a vacuum sealing relationship. Vacuum seals are not shown in these conceptual drawings but such seals are well-known and need not be further specified. A fixture 56 is brazed or otherwise hermetically-joined to the end of tubular member 54 to provide a sealing closure in conjunction with a sealing cap, not shown, when the crystal puller is evacuated.

Chain reloading is simplified in several aspects. First, it is unnecessary to disturb the vacuum seal 12' by opening the pulling head cover plate 12. Instead new chain is directed through the tubular means 54 after removal of the sealing plug. The new chain is guided through aperture 50 until it engages sprocket 24. The sprocket is actuated to rotate in its "lift" mode discharging chain into the storage area 26, or equivalent. When the chain end rests on the sprocket 24, the sprocket drive is reversed to its "down" mode and the chain is guided through internal guide plug 15 for attachment to the seed holder to initiate new crystal growth.

Since many changes can be made in the described construction and many apparently widely different embodiments of this invention can be made without departing from the scope thereof, it is intended that all matter contained in the above description and shown in the accompanying drawings shall be interpreted as illustrative and not in a limiting sense.

I claim:

1. In an apparatus for drawing a crystal from a melt, said apparatus comprising:
   (a) crucible means for holding said melt;
   (b) pulling-head means for drawing a seeded crystal from said melt;
   (c) means providing relative rotation between said melt and a crystal drawn therefrom along a vertical axis of rotation of said crystal; and
   (d) housing means to provide a sealed, contamination-free environment for the apparatus, including the pulling head, said pulling head comprising
      (i) seed-holder means for grasping a seeded crystal drawn from said melt,
      (ii) chain means, having a one end for pulling said seed-holder means along a vertical axis and another free end, said chain means comprising a plurality of flexibly coupled chain links,
      (iii) take-up means cooperating with said chain means, to move said seeded crystal along the vertical axis, said take-up means comprising sprocket means, including teeth spaced along the periphery thereof to engage said chain links, said sprocket means disposed to align a vertically oriented tangent from said sprocket means congruent with said vertical axis,
      (iv) means for rotating said sprocket means to move said chain along the vertical axis,
      (v) containment means to store the free end of untensioned chain taken up by said sprocket and chain discharged therefrom, (vi) the housing means enclosing said pulling head and comprising a cover plate disposed above said sprocket and characterized by an aperture in said cover plate vertically aligned with the plane of said sprocket, and (vii) sealing means to seal hermetically the aperture, whereby the chain means may be replaced without removing of the cover plate and breaking into the sealed environment of the pulling head, by directing new chain through the aperture and into engagement with the sprocket means.

2. The apparatus of claim 1 which includes tubular means communicating with said aperture, for guiding a chain to engage said sprocket during the introduction of the replacement chain to said sprocket.

3. The apparatus of claim 2 wherein said tubular means includes a removable, sealing-plug means at the one end thereof, whereby the pulling head is hermetically sealed before and after the introduction of the replacement chain.

4. The apparatus of claim 1 wherein said chain means comprises a plurality of generally uniform, coupled, spherical beads.

5. The apparatus of claim 1 wherein said sprocket means comprises a right, cylindrical section having a plurality of concave pockets on the surface thereof, which pockets conform to the links of the chain.

6. The apparatus of claim 1 wherein the aperture is positioned directly above and centrally of the axis of the sprocket and in the plane of the sprocket.

* * * * *